United States Patent
Hikosaka et al.

(10) Patent No.: US 7,371,961 B2
(45) Date of Patent: May 13, 2008

(54) SOLAR CELL MODULE

(75) Inventors: Masaru Hikosaka, Sumoto (JP);
Toshio Yagiura, Kobe (JP)

(73) Assignee: Sanyo Electric Co., Ltd.,
Moriguchi-Shi (JP)

( * ) Notice: Subject to any disclaimer, the term of this patent is extended or adjusted under 35 U.S.C. 154(b) by 518 days.

(21) Appl. No.: 10/393,997

(22) Filed: Mar. 24, 2003

(65) Prior Publication Data

US 2003/0178056 A1 Sep. 25, 2003

(30) Foreign Application Priority Data

Mar. 25, 2002 (JP) .............................. 2002-084540

(51) Int. Cl.
*H01L 31/048* (2006.01)

(52) U.S. Cl. ..................... 136/251; 136/244

(58) Field of Classification Search ............... 136/244, 136/251

See application file for complete search history.

(56) References Cited

U.S. PATENT DOCUMENTS 6,437,235 B1 * 8/2002 Komori et al. ............. 136/251
6,818,819 B2 * 11/2004 Morizane et al. .......... 136/251

FOREIGN PATENT DOCUMENTS

| CN | 1093833 A | 10/1994 |
|---|---|---|
| CN | 1114467 A | 1/1996 |
| JP | 59-072778 | 4/1984 |
| JP | 59072778 A * | 4/1984 |
| JP | 61-104563 | 7/1986 |
| JP | 61-104563 U * | 7/1986 |
| JP | 63-16463 | 2/1988 |
| JP | 7-131046 | 5/1995 |
| JP | 7-297439 | 11/1995 |
| JP | 10-233521 | 9/1998 |
| JP | 11-195804 | 7/1999 |
| JP | 2000-243998 | 9/2000 |
| JP | 2000-294813 | 10/2000 |
| JP | 2001-94135 | 4/2001 |

OTHER PUBLICATIONS

Office Action mailed Dec. 14, 2004, with English translation, and English certification dated Jan. 13, 2005.
Chinese Office Action (with English translation thereof) dated Mar. 26, 2004, and Certification dated Jun. 11, 2004.

* cited by examiner

*Primary Examiner*—Nam Nguyen
*Assistant Examiner*—Anthony Fick
(74) *Attorney, Agent, or Firm*—Kratz, Quintos & Hanson, LLP.

(57) ABSTRACT

A plurality of solar cells and a synthetic resin sheet (PET) with good insulating properties are sealed between a glass plate and a protective film (PVF/Al/PVF) by a sealing resin (EVA). The area of an Al foil of the protective film is larger than the area where the solar cells are present and smaller than the aperture area of an aluminum frame body. The solar cells or their wiring tab protrusions do not come into contact with the Al foil of the protective film. Moreover, the Al foil does not come into contact with the frame body at the edge.

4 Claims, 6 Drawing Sheets

SOLAR CELL MODULE

BACKGROUND OF THE INVENTION

The present invention relates to a solar cell module which is mounted on the roof of a house, etc. for photovoltaic power generation.

Photovoltaic power generation for converting light energy into electrical energy by using a photoelectric conversion effect has been widely used as means for obtaining clean energy. Besides, with an improvement in the photoelectric conversion efficiency of solar cells, a photovoltaic power generation system using a large number of solar cell modules is being operated even in private houses.

FIG. 1 is a view showing the outside structure of a general solar cell module, and FIG. 2 is a cross sectional view of a conventional solar cell module cut along the X-X line of FIG. 1. In these figures, the numeral 7 denotes a rectangular frame body made of aluminum. There is a recessed section in the upper half of the frame body 7, and a glass plate 1 and a protective film 50 are mounted in this upper recessed section at a suitable distance therebetween through a filler 6 made from silicone. The protective film 50 comprises weatherproof sheets 50b made, for example, of PVF (polyvinyl fluoride) and sandwiching an Al foil 50a, and has weatherproof properties, particularly high moisture-proof properties. A plurality of solar cells 2 are sealed between the glass plate 1 and the protective film 50 by a sealing resin 3 made from EVA (ethylene vinyl acetate). In some cases, each solar cell has a wiring tab protrusion 2a.

The solar cell module comprising the moisture-proof protective film 50 including the Al foil 50a has an insulation problem for the following reasons. Specifically, there are cases where the internal solar cell 2 or its wiring tab protrusion 2a comes into contact with the Al foil 50a of the protective film 50 (the part A in FIG. 2) and a short circuit occurs between the Al foil 50a of the protective film 50 and the frame body 7 (the parts B and C in FIG. 2) particularly when it is raining, and consequently the insulating characteristics deteriorate.

BRIEF SUMMARY OF THE INVENTION

An object of the present invention is to provide a solar cell module capable of ensuring high insulation performance and achieving improved withstand voltage performance and improved reliability in long-term use.

A solar cell module according to the first aspect is a solar cell module comprising solar cells sealed between a first protective layer and a moisture-proof second protective layer, and comprises an insulating resin sheet between the second protective layer and the solar cells.

In the solar cell module of the first aspect, since the insulating resin sheet is placed between the second protective layer (protective film) including a metal foil and the solar cells, the solar cell or its wiring tab protrusion does not come into contact with the metal foil of the second protective layer (protective film), thereby maintaining high insulation between the solar cells and the second protective layer (protective film).

A solar cell module according to the second aspect is based on the first aspect, and further comprises a metal frame body having an aperture portion in which the first protective layer, second protective layer, solar cells and resin sheet are present, wherein the second protective layer has an area larger than the area where the solar cells are present and smaller than the aperture area of the frame body.

In the solar cell module of the second aspect, since the area of the second protective layer (protective film) is made smaller than the aperture area of the frame body, the metal foil of the second protective layer (protective film) does not come into contact with the frame body, thereby preventing a short circuit between the second protective layer (protective film) and the frame body. Moreover, since the area of the second protective layer (protective film) is larger than the area where the solar cells are present, it is possible to prevent entry of moisture into the solar cells.

A solar cell module according to the third aspect is a solar cell module comprising solar cells sealed between a first protective layer and a moisture-proof second protective layer, and comprises an insulating resin sheet on a side of the second protective layer opposite to the solar cells.

In the solar cell module of the third aspect, since the insulating resin sheet is placed on the side of the second protective layer (protective film) opposite to the solar cells, even when the solar cell or its wiring tab protrusion comes into contact with a metal foil of the second protective layer (protective film), the insulating resin sheet placed below the metal foil prevents further contact with a meal frame body, thereby maintaining high insulation.

A solar cell module according to the fourth aspect is a solar cell module comprising solar cells sealed between a first protective layer and a moisture-proof second protective layer in an aperture portion of a metal frame body, the second protective layer including a metal foil, wherein the metal foil has an area larger than the area where the solar cells are present and smaller than the aperture area of the frame body.

In the solar cell module of the fourth aspect, since the area of the metal foil of the second protective layer (protective film) is made smaller than the aperture area of the frame body, the metal foil does not come into contact with the frame body, thereby preventing a short circuit between the second protective layer (protective film) and the frame body. In addition, since the area of the metal foil is larger than the area where the solar cells are present, it is possible to prevent entry of moisture into the solar cells.

The above and further objects and features of the invention will more fully be apparent from the following detailed description with accompanying drawings.

DETAILED DESCRIPTION OF THE INVENTION

The following description will explain the present invention in detail, based on the drawings illustrating some embodiments thereof.

First Embodiment

Figure 1:
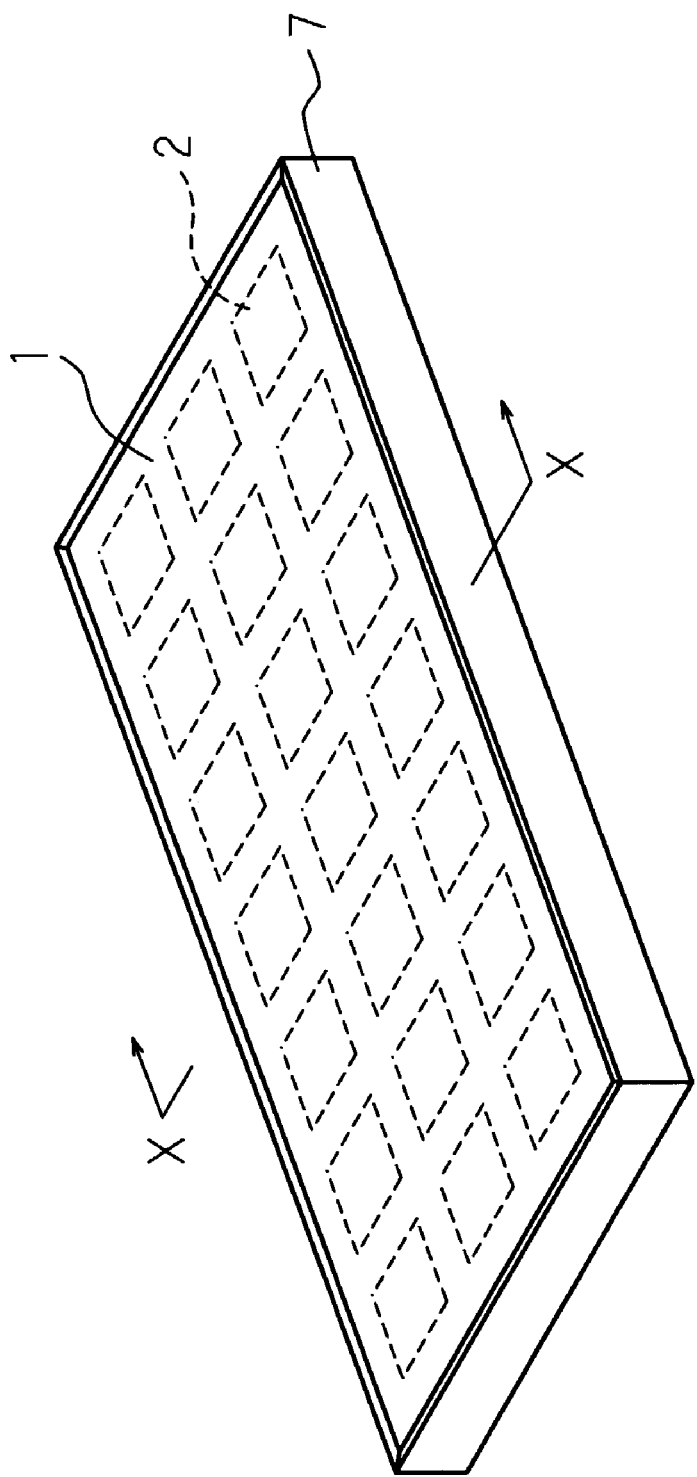
FIG. 1 is a view showing the outside structure of a general solar cell module.
Figure 2:
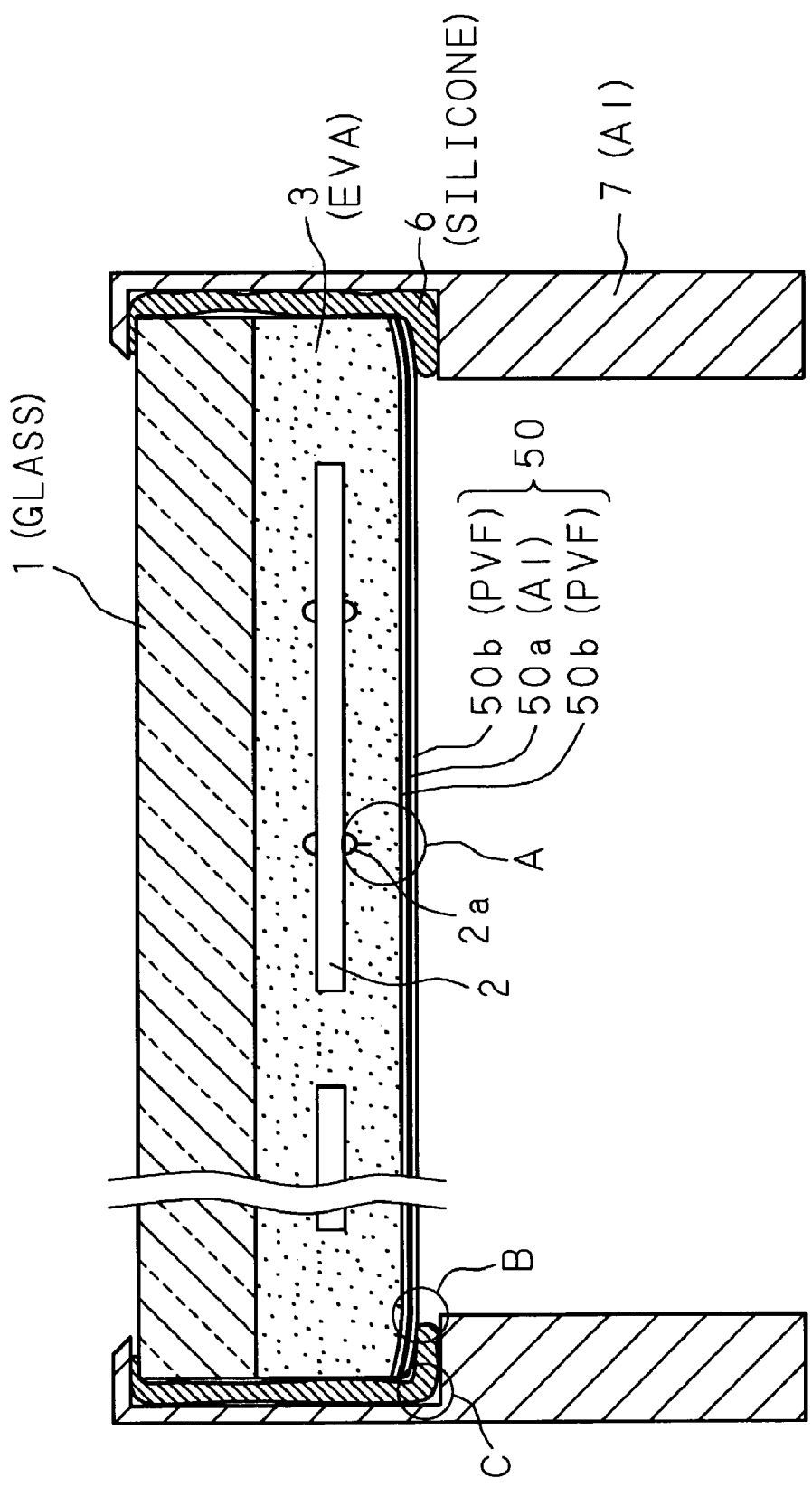
FIG. 2 is a cross sectional view of a conventional solar cell module.
Figure 3:
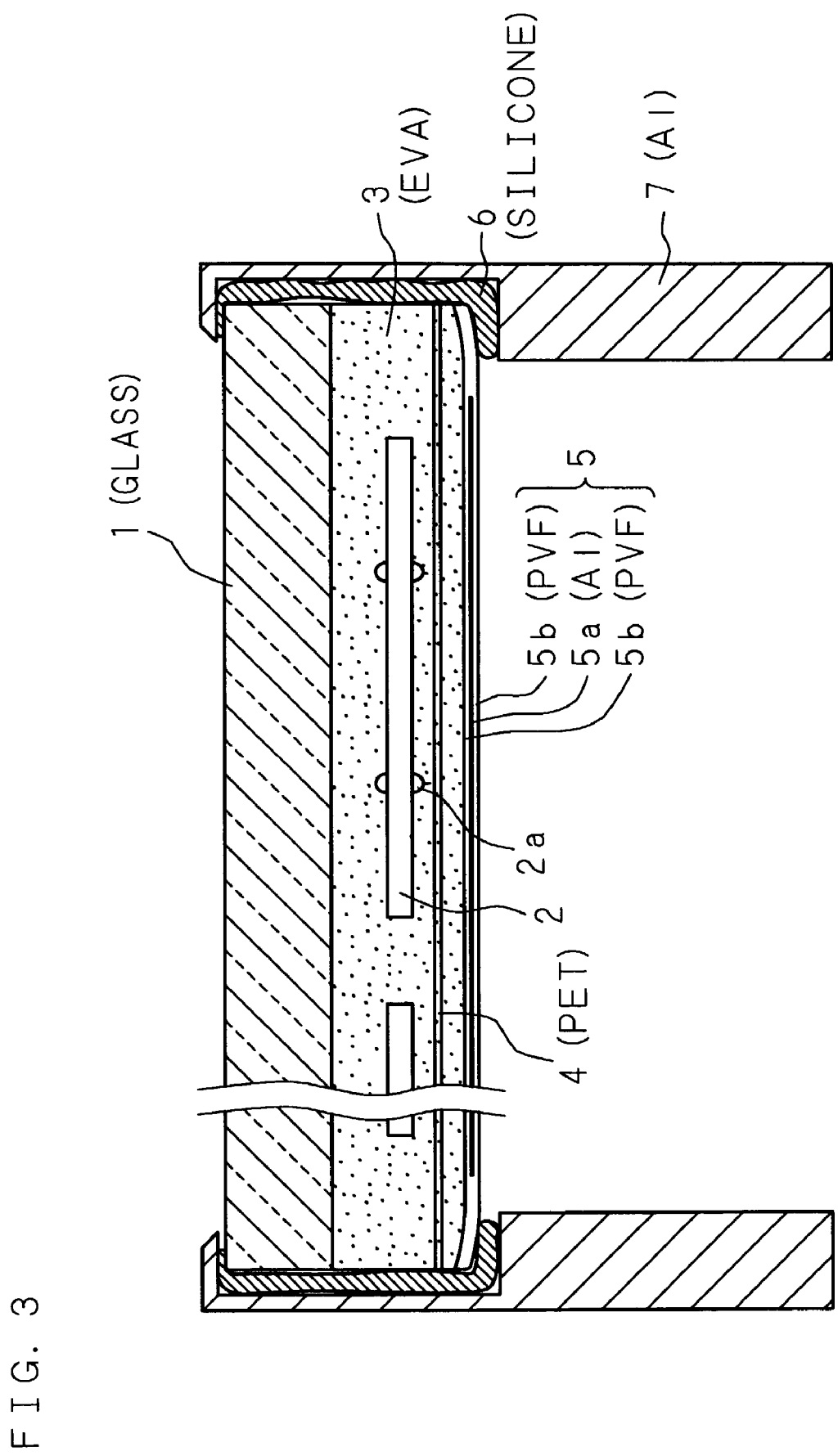
FIG. 3 is a cross sectional view of a solar cell module of the first embodiment of the present invention.

FIG. 3 is a cross sectional view of a solar cell module of the first embodiment, cut along the X-X line of FIG. 1. In FIG. 3, the numeral 7 denotes a rectangular frame body made of Al, for example. There is a recessed section in the upper half of the frame body 7, and a glass plate 1 as a first protective layer and a protective film 5 as a second protective layer are mounted in this upper recessed section at a suitable distance therebetween through a filler 6 made from silicone, for example. The protective film 5 comprises weatherproof sheets 5b made, for example, of PVF and sandwiching an Al foil 5a, and has weatherproof properties, particularly high moisture-proof properties.

A plurality of solar cells 2 and a synthetic resin sheet 4 with good insulating properties made from PET (polyethylene telephthalate), for example, are sealed between the glass plate 1 and the protective film 5 in this order from the glass plate 1 side by a sealing resin 3 made from EVA. The space between the solar cells 2 and the synthetic resin sheet 4 is also filled with the sealing resin 3. In some cases, each solar cell 2 has a wiring tab protrusion 2a.

The Al foil 5a of the protective film 5 is smaller than the weatherproof sheets 5b sandwiching the Al foil 5a. The area of the Al foil 5a is larger than the area where the solar cells 2 are present and smaller than the aperture area of the frame body 7.

In the first embodiment, since the synthetic resin sheet 4 with insulating properties is placed between the protective film 5 including the Al foil 5a and the solar cells 2, the solar cells 2 or their wiring tab protrusions 2a do not come into contact with the Al foil 5a of the protective film 5, thereby maintaining high insulation between the solar cells 2 and the protective film 5. Moreover, since the size of the Al foil 5a is made smaller than the innermost size of the frame body 7 (the inside size of the lower thick part of the frame body 7), the Al foil 5a does not come into contact with the frame body 7 at the edge, thereby preventing a short circuit between the protective film 5 and the frame body 7. Since the size of the Al foil 5a is made larger than the area where the solar cells 2 are present, it is possible to satisfactorily prevent entry of moisture into the solar cells 2 from the back-face side.

Note that although the size of the Al foil 5a is smaller than the weatherproof sheets 5b in the example shown in FIG. 3, the Al foil 5a and the weatherproof sheets 5b may be formed in the same size.

Second Embodiment

Figure 4:
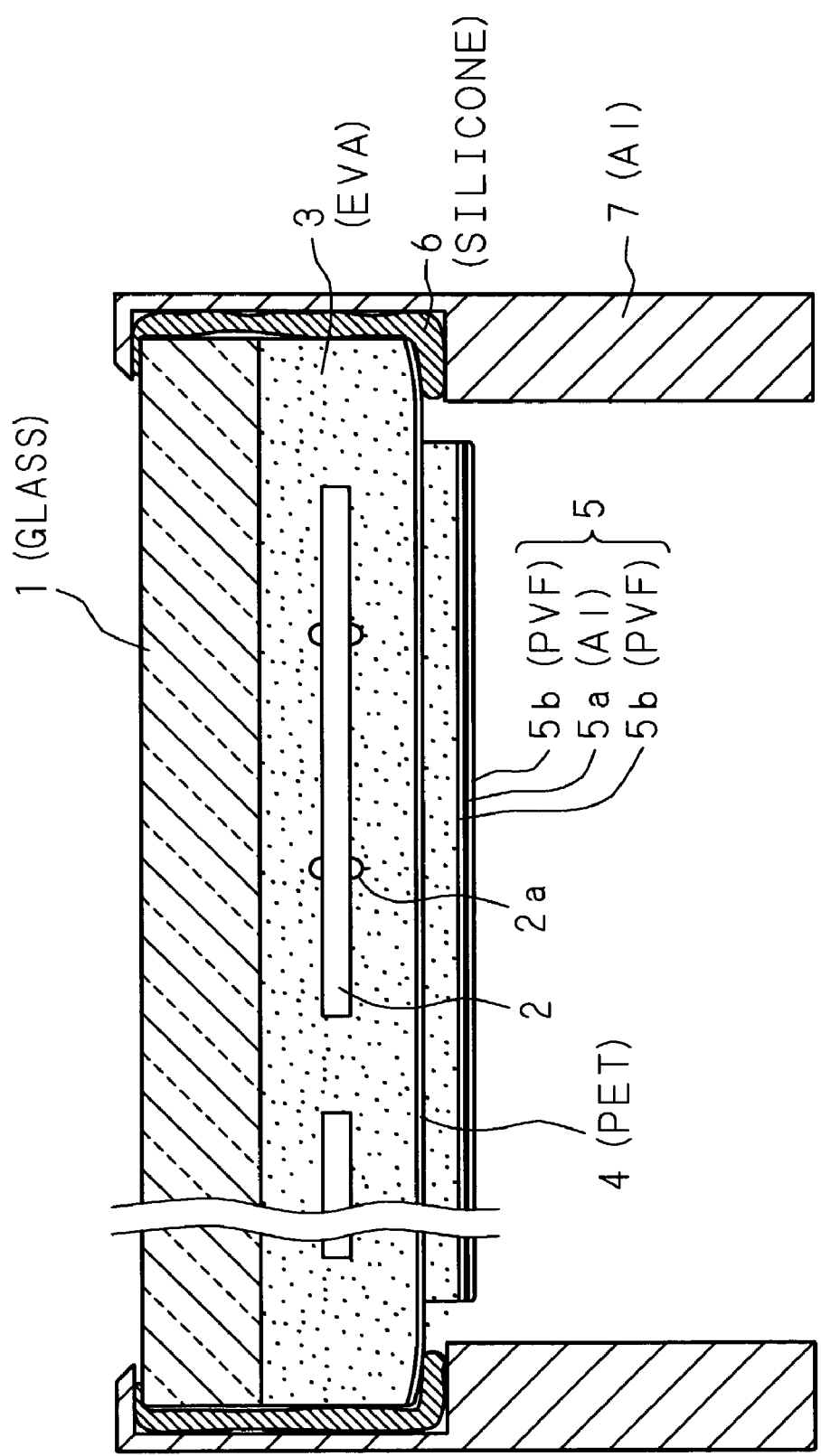
FIG. 4 is cross sectional view of a solar cell module of the second embodiment of the present invention.

FIG. 4 is cross sectional view of a solar cell module of the second embodiment, cut along the X-X line of FIG. 1. In FIG. 4, the same parts as in FIG. 3 are designated with the same numbers, and the explanation thereof is omitted. In the second embodiment, like the first embodiment, the synthetic resin sheet 4 with good insulating properties is sealed between the solar cells 2 and the protective film 5. In the first embodiment, only the area of the Al foil 5a is made larger than the area where the solar cells 2 are present and smaller than the aperture area of the frame body 7. Whereas, in the second embodiment, the Al foil 5a and weatherproof sheets 5b, i.e., the area of the whole protective film 5 is made larger than the area where the solar cells 2 are present and smaller than the aperture area of the frame body 7.

Therefore, the second embodiment also has the effect of maintaining high insulation similarly to the first embodiment. In the first and second embodiments, if a synthetic resin with high light reflectance is used on the solar cell 2 side of the protective film 5, a large amount of reflected light from the protective film 5 is reflected again by the glass plate 1 and enters the solar cells 2, and consequently an improvement in the output characteristics of the module is achieved.

Third Embodiment

Figure 5:
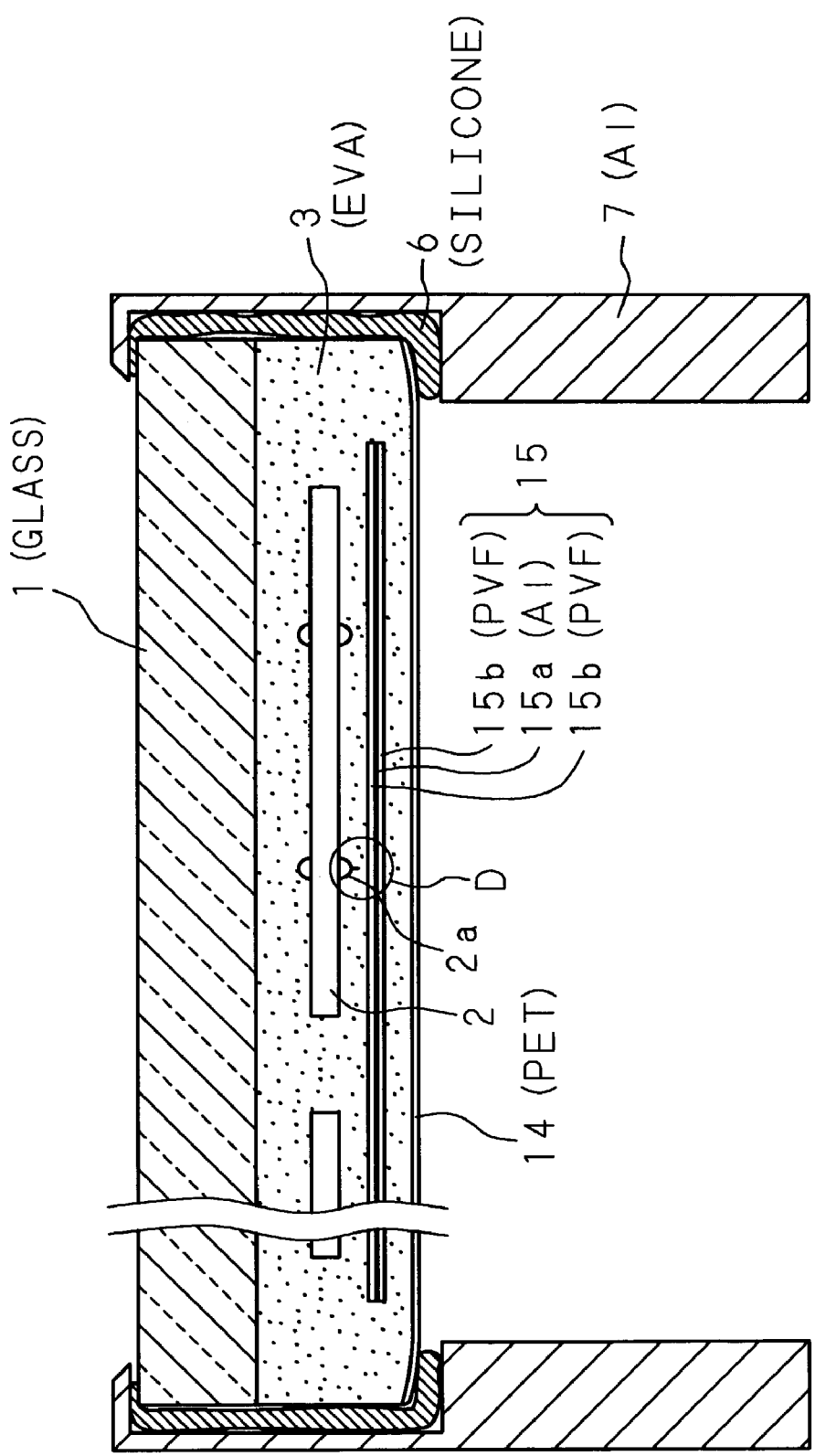
FIG. 5 is a cross sectional view of a solar cell module of the third embodiment of the present invention.

FIG. 5 is cross sectional view of a solar cell module of the third embodiment, cut along the X-X line of FIG. 1. In FIG. 5, the numeral 7 denotes a rectangular frame body made of Al, for example. There is a recessed section in the upper half of the frame body 7, and a glass plate 1 as a first protective layer and a synthetic resin sheet 14 with good insulation properties made from PET are mounted in this upper recessed section at a suitable distance therebetween through a filler 6 made from silicone, for example.

For example, a plurality of double-side light incident type solar cells 2 and a protective film 15 as a second protective layer are sealed between the glass plate 1 and the synthetic resin sheet 14 in this order from the glass plate 1 side by a sealing resin 3 made from EVA. The protective film 15 comprises weatherproof sheets 15b made, for example, of PVF and sandwiching an Al foil 15a as a metal foil, and has weatherproof properties, particularly high moisture-proof properties. The area of the protective film 15 is made larger than the area where the solar cells 2 are present and smaller than the aperture area of the frame body 7. The space between the solar cells 2 and the protective film 15 is also filled with the sealing resin 3.

In the third embodiment, even when the solar cell 2 or its wiring tab protrusion 2a comes into contact with the Al foil 15a of the protective film 15 (the part D in FIG. 5), since the insulating synthetic resin sheet 14 is placed on the back side, it is possible to prevent a short-circuit between the solar cell 2 and protective film 15 and the frame body 7 by this synthetic resin sheet 14. Moreover, since the size of the protective film 15 including the Al foil 15a is made smaller than the innermost size of the frame body 7, it is possible to prevent a short-circuit between the protective film 15 and the frame body 7 at the edge. Accordingly, high insulating properties are maintained. Since the size of the protective film 15 is made larger than the area where the solar cells 2 are present, it is possible to satisfactorily prevent entry of moisture into the solar cells 2 from the back-face side.

Note that the protective film 15 may be a two-layers constructive film of an Al foil 15a and a weatherproof sheet 15b placed on the solar cell 2 side.

In this third embodiment, if a synthetic resin (for example, E20 (PET) available from Toray Industries. Inc.) with high light reflectance (a light reflectance of not lower than 65% for light with a wavelength of 340 to 1200 nm) is used on the solar cell 2 side surface of the protective film 15, a large amount of reflected light from the protective film 15 enters the solar cells 2, and consequently an improvement in the output characteristics of the module is achieved.

Note that although the above-described first through third embodiments use PET as the material of the synthetic resin sheet 4, 14 having insulating properties, it is possible to use PEN (polyethylene naphthalate), PPS (polyphenylene sulfide), PVF, PVDF (polyvinylidene fluoride), ETFE (tetrafluoroethylene), FRP (fiber reinforced plastic), polycarbonate, or a composite sheet made from a plurality of materials selected from the group consisting of the above materials and PET.

Fourth Embodiment

Figure 6:
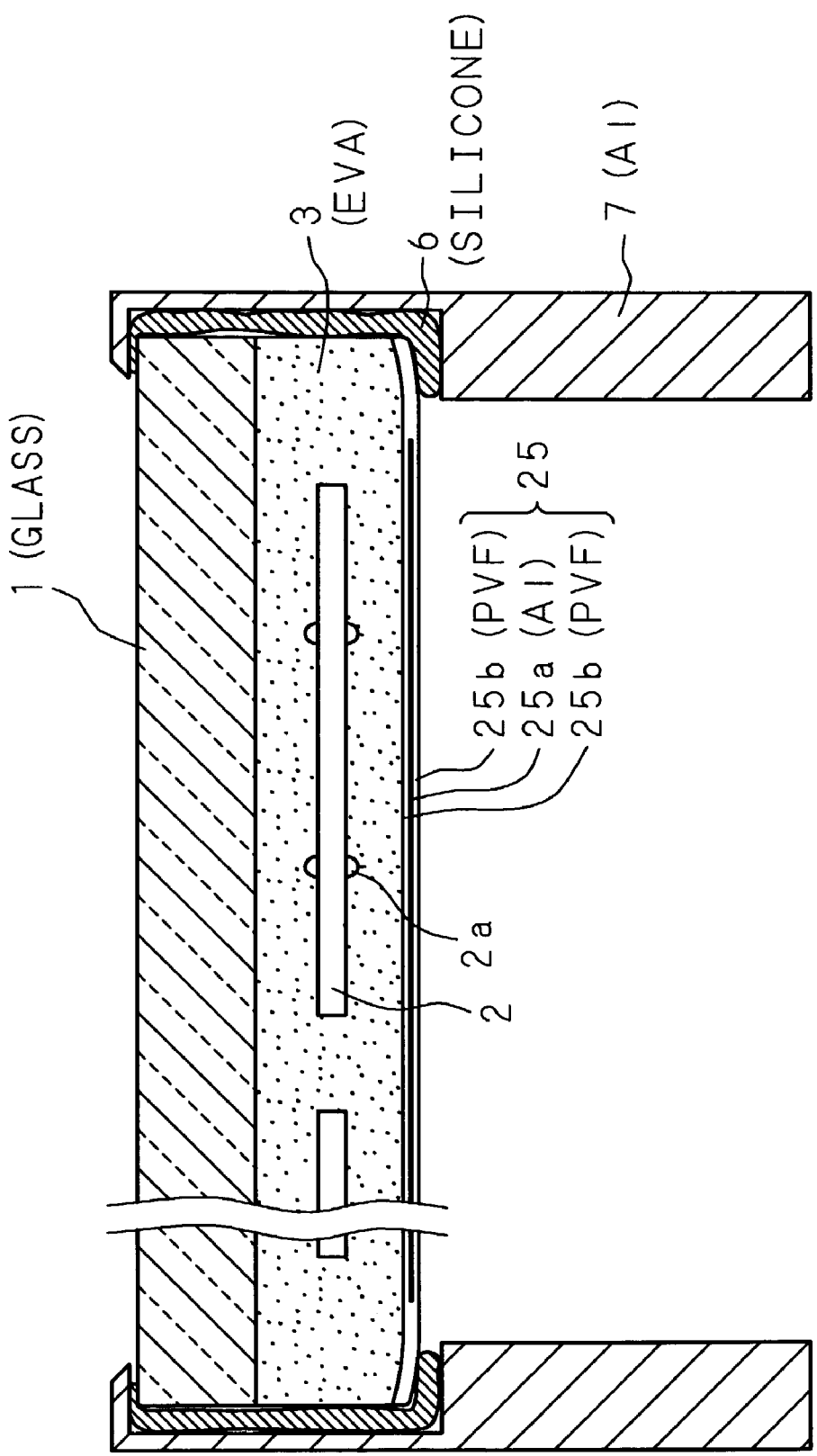
FIG. 6 is cross sectional view of a solar cell module of the fourth embodiment of the present invention.

FIG. 6 is cross sectional view of a solar cell module of the fourth embodiment, cut along the X-X line of FIG. 1. The fourth embodiment is an example designed to improve the insulating properties in a simple manner, without providing the synthetic resin sheet 4, 14 having insulating properties as in the first through third embodiments.

In FIG. 6, the numeral 7 denotes a rectangular frame body made of Al, for example. There is a recessed section in the upper half of the frame body 7, and a glass plate 1 as a first protective layer and a protective film 25 as a second protective layer are mounted in this upper recessed section at a suitable distance therebetween through a filler 6 made from silicone, for example. A plurality of solar cells 2 are sealed between the glass plate 1 and the protective film 25 by a sealing resin 3 made from EVA.

The protective film 25 comprises weatherproof sheets 25b made, for example, of PVF and sandwiching an Al foil 25a as a metal foil, and has weatherproof properties, particularly high moisture-proof properties. The area of the Al foil 25a of the protective film 25 is made smaller than the weatherproof sheets 25b sandwiching the Al foil 25a, larger than the area where the solar cells 2 are present, and smaller than the aperture area of the frame body 7.

In the fourth embodiment, since the size of the Al foil 25a of the protective film 25 is made smaller than the innermost size of the frame body 7, the Al foil 25a prevents a short-circuit with the frame body 7, thereby maintaining high insulating properties. Since the size of the Al foil 25a is made larger than the area where the solar cells 2 are present, it is possible to satisfactorily prevent entry of moisture from the back-face side. In the fourth embodiment, if a synthetic resin with high light reflectance is used on the solar cell 2 side surface of the protective film 25, a large amount of reflected light from the protective film 25 is reflected again by the glass plate 1 and enters the solar cells 2, and consequently an improvement in the output characteristics of the module is achieved.

Note that although the above-described embodiments use Al as the material of the metal foil of the protective film 5, 15, 25, it is possible to use Fe or Zn.

Besides, in the fourth embodiment, although PVF is used as the material of the weatherproof sheet 25b, it is possible to use PEN, PPS, PET, PVDF, ETFE, FRP, polycarbonate, or a composite sheet made from a plurality of materials selected from the group consisting of the above materials and PVF.

In addition, although each of the above-described embodiments comprises the Al frame body 7, the frame body 7 is not essential for the solar cell module of the present invention, and thus it is not necessarily to comprise the frame body 7.

As described above, with the solar cell module of the present invention, since high insulation performance is obtained and improved withstand voltage performance is achieved, it is possible to realize improved safety and improved long-term reliability when the solar cell module is used in a high-voltage photovoltaic power generation system.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A solar cell module, comprising:
a first protective layer;
a second protective layer which comprises metal foil sandwiched by waterproof sheets;
solar cells sealed between said first protective layer and said second protective layer;
an insulating resin sheet adhered on a side of said second protective layer opposite to said solar cells by a resin; and
a metal frame body in which said first protective layer, second protective layer, solar cells and insulating resin sheet are present;
wherein said second protective layer has an area larger than an area where said solar cells are present and smaller than an area of said insulating resin sheet; and
said resin exists between said second protective layer and said metal frame body.

2. The solar cell module of claim 1, further comprising:
a frame body, wherein a sealing resin exists between said second protective layer and said frame body.

3. The solar cell module of claim 2,
wherein said resin sheet is a sheet of a single material selected from the group consisting of polyethylene terephthalate, polyethylene naphthalate, polyphenylene sulfide, polyvinyl fluoride, polyvinylidene fluoride, tetrafluoroethylene, fiber reinforced plastic and polycarbonate, or a composite sheet of a plurality of materials selected from said group.

4. The solar cell module of claim 1,
wherein said resin sheet is a sheet of a single material selected from the group consisting of polyethylene terephthalate, polyethylene naphthalate, polyphenylene sulfide, polyvinyl fluoride, polyvinylidene fluoride, tetrafluoroethylene, fiber reinforced plastic and polycarbonate, or a composite sheet of a plurality of materials selected from said group.

* * * * *